United States Patent [19]

Kawai

[11] 4,251,849
[45] Feb. 17, 1981

[54] TRIMMER CAPACITOR

[75] Inventor: Takashi Kawai, Soma, Japan

[73] Assignee: Alps Electric Co., Ltd., Tokyo, Japan

[21] Appl. No.: 946,101

[22] Filed: Sep. 27, 1978

[30] Foreign Application Priority Data

Sep. 27, 1977 [JP] Japan .......................... 52/129530[U]

[51] Int. Cl.³ ............................................... H01G 5/16
[52] U.S. Cl. ................................... 361/278; 361/287;
361/290; 361/400
[58] Field of Search ............... 361/287, 298, 290, 278,
361/400, 404

[56] References Cited

U.S. PATENT DOCUMENTS

| 1,911,360 | 5/1933 | Gilling | 361/298 |
| 3,142,981 | 8/1964 | Gross | 361/290 X |
| 3,183,912 | 5/1965 | Mogilner | 361/290 X |
| 3,277,353 | 10/1966 | Jenkins | 361/293 |
| 3,679,940 | 7/1972 | Newman | 361/400 |
| 3,846,780 | 11/1974 | Gilcher | 361/278 |

FOREIGN PATENT DOCUMENTS 207649 6/1973 United Kingdom ..................... 361/278

Primary Examiner—E. A. Goldberg
Attorney, Agent, or Firm—Guy W. Shoup; Gerard F. Dunne

[57] ABSTRACT

A trimmer capacitor comprises a metallic plate member which is generally U-shaped, and an elongate conductor member which is to be located inside the metallic plate. Both the metallic plate member and the conductor member can be fixed to a printed circuit board. By bending the conductor member to displace it inside the metallic plate member, the electrostatic capacitance formed between the metallic plate member and the conductor member can be varied.

8 Claims, 2 Drawing Figures

TRIMMER CAPACITOR

BACKGROUND OF THE INVENTION

1. Field of the Invention

The present invention relates to capacitors and more particularly, to a miniature trimmer capacitor for use in, for example, a tuner of the electronic tuning type.

2. Description of the Prior Art

Trimmer capacitors, such as that disclosed in U.S. Pat. No. 3,617,831, in which an elongate electrode is movable lengthways within a tubular dielectric having an external electrode, as well as that disclosed in U.S. Pat. No. 3,679,940, which includes an electrode in the form of a clip, are known. Such known trimmer capacitors, however, often have at least three discrete components and thus assembly can be quite complicated. Moreover, the trimmer capacitors occupy a relatively large area when mounted on a printed circuit board.

SUMMARY OF THE INVENTION

An object of the present invention is to provide a trimmer capacitor which has a very simple structure.

Another object of the present invention is to provide a trimmer capacitor which can be assembled easily and can have the value of its capacitance adjusted readily.

Still another object of the present invention is to provide a trimmer capacitor having only two constituent parts.

Yet another object of the present invention is to provide a trimmer capacitor having a low capacitance (several pF) and which can be mounted directly onto a printed circuit board of a tuner of the type employing a varactor diode.

In a preferred embodiment of the present invention, a capacitor includes a U-shaped metallic plate member and a conductor member which may be an ordinary electric wire. Both the metallic plate member and the electric wire can be electrically connected with circuit patterns at predetermined positions on a printed circuit board, and can be fixed onto the board. The principal part of the electric wire is mostly located within the space defined by the U-shaped part of the metallic plate member. Thus, the capacitance can be varied by displacing the electric wire inside the metallic plate member.

DESCRIPTION OF THE PREFERRED EMBODIMENT

Figure 1:
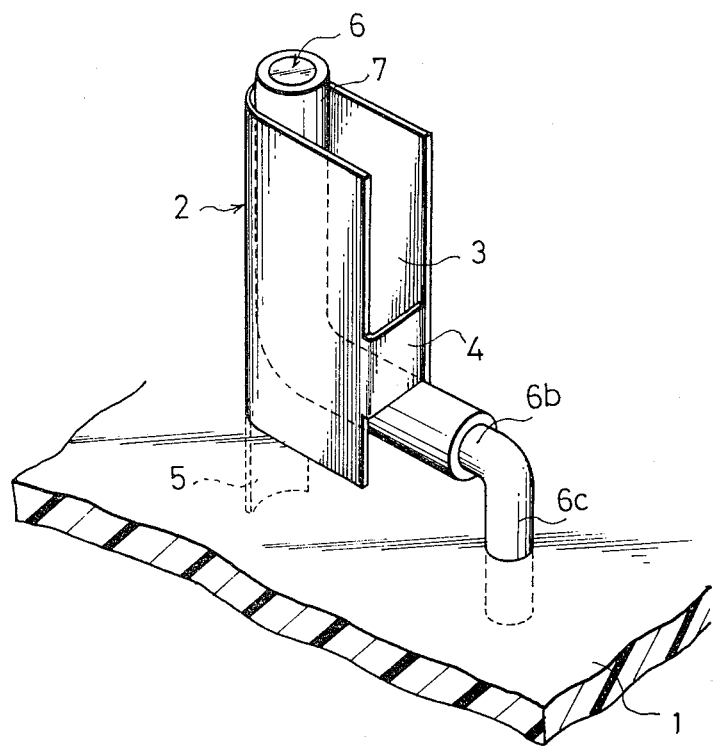
FIG. 1 shows a perspective view of a trimmer capacitor embodying the present invention.

Referring to FIG. 1, a metallic plate member 2 and a conductor member 6 are each fixed onto a printed circuit board 1. The metallic plate member 2 is made by bending a metallic plate, for example a brass plate, so that its cross-section may generally form the letter U. The plate member thus has two spaced apart side panels interconnected by a base portion extending between facing end portions of the side panels. The side panels extend in a generally parallel manner to an open end or face 3 extending longitudinally of the plate member. At a lower part of the open face 3, a tab portion 4 is bent from a side panel. The tab portion serves to prevent the conductor member 6 from falling off the printed circuit board 1 and is formed so as to partially close the open face 3. Numeral 5 designates a mounting portion which is integrally formed at a lower part of the metallic plate member 2. Mounting portion 5 is inserted through a hole provided in the printed circuit board 1, and preferably is soldered to a conductive circuit pattern formed on the rear surface of the board 1.

The conductor member 6 is provided with an insulating layer 7. Preferably, the conductor member possesses a pliability to the extent that it can be easily bent with a person's fingers, radio pliers or the like, and also has a rigidity to the extent that any condition the conductor member 6 is bent into will be firmly maintained. In the present embodiment, a copper wire coated with polyvinyl chloride, as is commercially available, is used.

The conductor member 6 comprises an elongate portion 6a which is shown generally parallel to the longitudinal axis of the metallic plate member 2, a transverse portion 6b which is generally parallel to the plane of the printed circuit board 1, and a fixing portion 6c which is mounted on the printed circuit board 1. The transverse portion 6b extends from the interior of the metallic plate member 2, through the opening under the tab portion 4 and to the exterior of the metallic plate 2. In the fixing portion 6c, the insulative coating has been stripped off.

Figure 2:
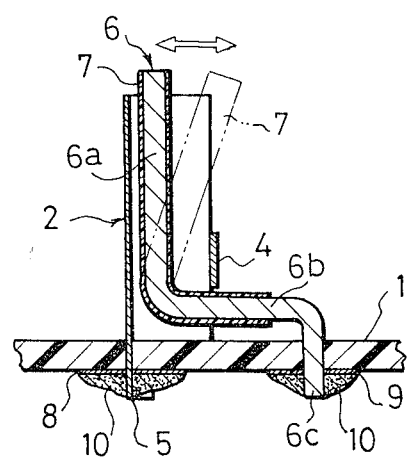
FIG. 2 shows a sectional inside view of the trimmer capacitor of the embodiment illustrated in FIG. 1.

As shown in FIG. 2, the mounting portion 5 of the metallic plate 2 and the fixing portion 6c of the conductor member 6 penetrate through respective holes provided in the printed circuit board 1, and are respectively soldered and fixed to predetermined portions of conductive circuit patterns 8 and 9 on the rear surface of the board 1.

The present embodiment can be used as a trimmer capacitor wherein the metallic plate member 2 and the conductor member 6 function as electrodes, and wherein the insulating layer 7 as well as any air gap between the electrodes 2 and 6 function as a dielectric. Accordingly, when the conductor member 6 is moved in the direction of the arrow indicated in FIG. 2, the electrostatic capacitance formed between the metallic plate member 2 and the conductor member 6 can be varied. Also, the transverse portion 6b of the conductor member 6 is resiliently biased upwardly so as to abut against the lower edge of the tab portion 4 of the metallic plate member 2. Thus, any positional deviation of the conductor member 6 can be prevented, and in adjusting the capacitance, the tab portion 4 can be utilized as a fulcrum for the bending of the conductor member.

The printed circuit board 1 in the present embodiment has components such as transistors and resistors attached thereto as well as the trimmer capacitor of the present invention. That is, the trimmer capacitor of the present invention can be mounted on a part of the printed circuit board having a large number of components attached thereto, without occupying a large place. If desired, it will be possible to mount the trigger capacitor on the printed circuit board simultaneously with the other components by the use of an automatic soldering machine. The trimmer capacitor above described may be assembled by first pulling the metallic plate member 2 and the conductor member 6 together as shown in FIG. 1, and thereafter mounting them on the printed circuit board 1 as a unit. After the adjustment of the capacitance, the metallic plate member 2 and the conductor member 6 may be fixed in their relative positions by a suitable means. It will be readily understood that a copper wire coated with polyvinyl chloride, which is commercially and easily available, can be used as the conductor member 6 of the trimmer capacitor according to this invention, and that selecting the diameter thereof as desired, the variable range of capacitance values of the trimmer capacitor can be changed.

What is claimed is:

1. A capacitor adapted to be mounted to a printed circuit board, comprising a conductive plate member having two spaced apart side panels adapted to extend generally perpendicularly from a printed circuit board and interconnected by a base portion extending between facing end portions of said side panels, said side panels extending generally parallel to form an open end of said plate member, said plate member having a mounting portion adapted to be connected to said circuit board; and a conductor member having a fixing portion adapted to be connected to a circuit pattern on said circuit board and an elongate portion extending between said side panels, said conductor member being bendable whereby said elongate portion can be moved between a position along said base portion and a position nearer said open end to vary capacitance value between said plate member and said conductor member, said plate member further including a tab portion extending across said open end to divide it into a first open portion and a second open portion.

2. A capacitor according to claim 1 said conductor member includes a transverse portion extending through said second open portion.

3. A capacitor according to claim 2, said transverse portion being biased resiliently against said tab portion and having an electrically insulating layer between said transverse portion and said tab portion.

4. A capacitor according to claim 3, said tab portion being adapted to function as the fulcrum for the bending of said conductor member.

5. A capacitor according to claim 2, said fixing portion and said elongate portion each being generally parallel to said base portion, and said transverse portion being generally perpendicular to and interconnecting said fixing portion and said elongate portion.

6. A capacitor according to claim 1, at least said elongate portion of said conductor member having an electrically insulating layer therearound.

7. A capacitor according to claim 1, said conductor member being an electric wire coated with polyvinyl chloride.

8. A capacitor according to claim 1, said conductor member having a dielectric layer therearound.

* * * * *